(12) United States Patent
Hakozaki et al.

(10) Patent No.: US 7,053,440 B2
(45) Date of Patent: May 30, 2006

(54) NON-VOLATILE SEMICONDUCTOR MEMORY DEVICE AND MANUFACTURING METHOD OF THE SAME

(75) Inventors: Kenji Hakozaki, Fukuyama (JP); Kenichi Tanaka, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/778,204

(22) Filed: Feb. 17, 2004

(65) Prior Publication Data
US 2004/0159879 A1    Aug. 19, 2004

(30) Foreign Application Priority Data
Feb. 18, 2003    (JP)    ............... 2003-040090

(51) Int. Cl.
*H01L 29/788*    (2006.01)
(52) U.S. Cl. .................. 257/315; 257/318; 257/322
(58) Field of Classification Search ................ 257/315, 257/318, 322
See application file for complete search history.

(56) References Cited

U.S. PATENT DOCUMENTS

| | | | | |
|---|---|---|---|---|
| 4,948,755 A | * | 8/1990 | Mo | ............................. 438/625 |
| 5,057,443 A | * | 10/1991 | Hutter | ......................... 438/330 |
| 6,194,755 B1 | * | 2/2001 | Gambino et al. | ........... 257/301 |
| 6,268,627 B1 | * | 7/2001 | Ishigaki et al. | ............. 257/336 |
| 6,438,030 B1 | * | 8/2002 | Hu et al. | ................ 365/185.18 |
| 6,730,959 B1 | * | 5/2004 | Hung et al. | .................. 257/316 |
| 6,844,588 B1 | * | 1/2005 | Cavins et al. | ................ 257/324 |
| 2004/0031996 A1 | * | 2/2004 | Brian Li et al. | ............ 257/408 |

FOREIGN PATENT DOCUMENTS

JP    10-074915    3/1998

\* cited by examiner

*Primary Examiner*—Tu-Tu Ho
(74) *Attorney, Agent, or Firm*—Nixon & Vanderhye P.C.

(57) ABSTRACT

A non-volatile semiconductor memory device comprising: a first conductive type well formed within a semiconductor substrate; and a memory cell having a gate insulating film, a floating gate, an insulating film, a control gate and a pair of source/drain region, the gate insulating film, the floating gate, the insulating film, the control gate being layered in this order above the first conductive type well, the pair of source/drain regions being made up of second conductive type diffusion layers and formed within the first conductive type well, wherein the source region is electrically connected to the first conductive type well.

9 Claims, 10 Drawing Sheets bit line BL   memory cell MC

Fig. 1 memory cell MC

NON-VOLATILE SEMICONDUCTOR MEMORY DEVICE AND MANUFACTURING METHOD OF THE SAME

CROSS-REFERENCE TO RELATED APPLICATIONS

This application is related to Japanese Patent Application No. 2003-40090 filed on Feb. 18, 2003 whose priority is claimed under 35 USC § 119, the disclosure of which is incorporated by reference in its entirety.

BACKGROUND OF THE INVENTION

1. Field of the Invention

The present invention relates to a non-volatile semiconductor memory device and a manufacturing method of the same. In particular, the present invention relates to a non-volatile semiconductor memory device having a floating gate, so as to carry out write-in and erasure of data by storing and releasing a charge in the floating gate, and relates to a manufacturing method of the same.

2. Description of the Related Art

Figure 15:
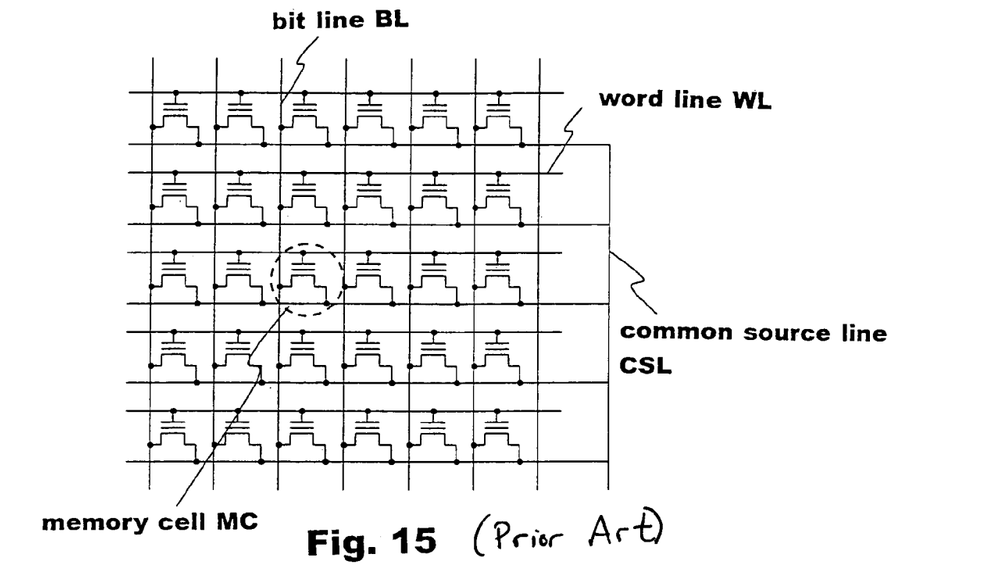
FIG. 15 is an equivalent circuit diagram showing a memory cell array of a non-volatile semiconductor memory device according to the prior art.

Conventionally, a NOR type flash memory, as shown in the equivalent circuit diagram of FIG. 15, has been known as a non-volatile semiconductor device. In this flash memory, bit lines BL connected to the drains of memory cells MC and word lines WL for selecting a control gate of memory cells MC are wired so as to cross at right angles wherein memory cells MC are aligned in a matrix form. The sources of memory cells MC are connected to a common source line CSL so that all of the sources within the same block are shared.

Figure 16:
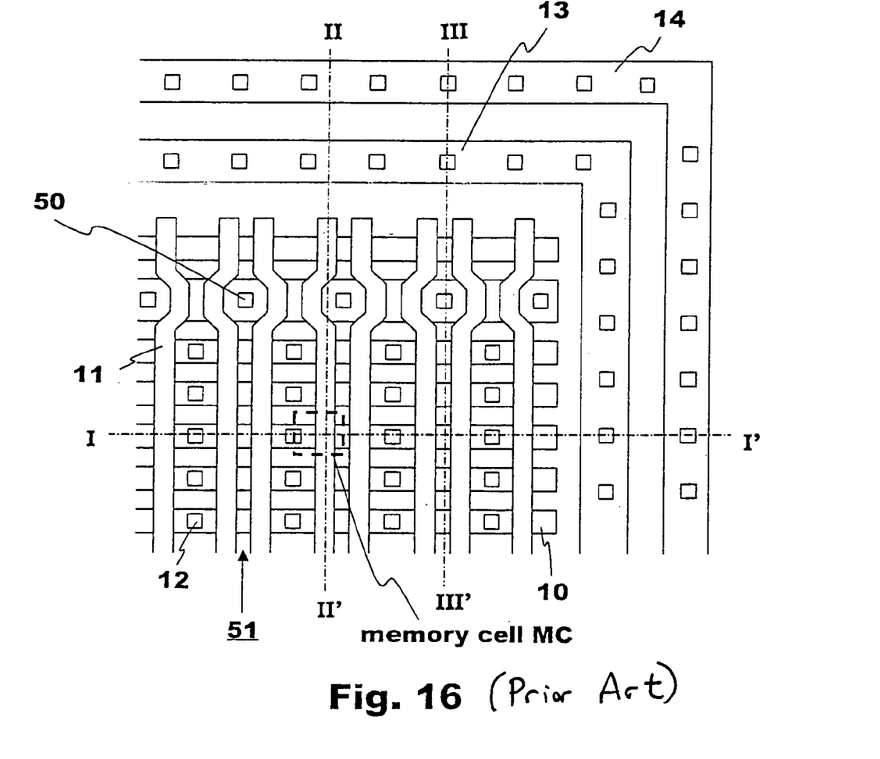
FIG. 16 is a plan view showing the memory cell array of the non-volatile semiconductor memory device according to the prior art.

In such a flash memory as shown in FIG. 16, control gates 11 (in the Y direction in FIG. 16) are aligned above active regions 10, which are aligned in a striped form (in the X direction in FIG. 16), so that the active regions 10 and the control gates 11 cross at right angles and floating gates (not shown) are arranged beneath the control gates 11 above the active regions 10 independently for every bit. In addition, the drains of memory cells MC are connected to bit lines BL via drain contacts 12 while word lines WL are wired parallel to the control gates 11 so that the word lines WL and the bit lines BL cross at right angles. On the other hand, diffusion wires 51 have been formed in such a manner that the diffusion wires 51 are self-aligned with the control gates 11 in the spaces between the control gates 11 on the source sides of the memory cells MC while the diffusion wires 51 are connected to metal wires in the upper layer via source contacts 50 placed in intervals ranging from several memory cells MC to several dozens of memory cells MC. A $P^+$ diffusion layer 13 for supplying a potential to the P well (not shown) of the memory cell region, and an $N^+$ diffusion layer 14 for supplying a potential to the N well (not shown), which is formed so as to surround the P well, are placed outside of the memory cell array and are connected to metal wires via contact plugs.

Figure 17:
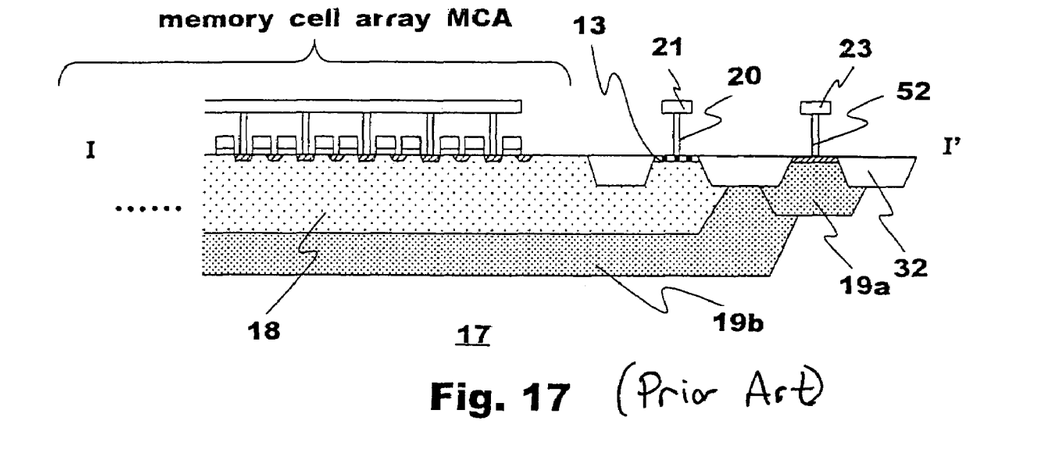
FIG. 17 is a cross sectional view along line I–I' of FIG. 16.

Memory cell array MCA of this flash memory is formed within a P well 18 which is formed within a silicon substrate 17 as shown in the cross sectional view of FIG. 17 where this P well 18 is surrounded by a deep N well 19b. A plurality of memory cells MC forms one block and each block is electrically isolated.

Figure 18:
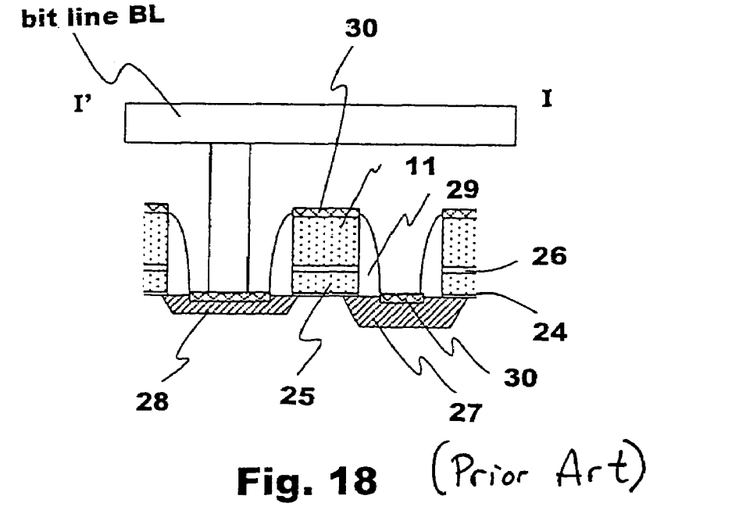
FIG. 18 is a cross sectional view along line I–I' of a portion of FIG. 16.

In a memory cell MC, a floating gate 25, an ONO film 26 and a control gate 11 are layered above a gate insulating film 24, formed on a P well 18 as shown in FIG. 18, where a source 27 and a drain 28 are formed of $N^+$ diffusion layers which have been formed so as to be self-aligned with the control gate 11. In addition, sidewalls 29 are formed on the sides of the floating gate 25 and the control gate 11, that have been layered, of an insulating film in a self-aligned manner. Silicide layers 30 are formed on the source 27, the drain 28 and the control gate 11 in a self-aligned manner. The drain 28 of the memory cell MC is placed in such a manner that the drain 28 is shared by the adjacent cell and is connected to a bit line BL by means of a contact plug. The bit line BL is wired so that the bit line BL and the control gate 11 cross at right angles.

Figure 19:
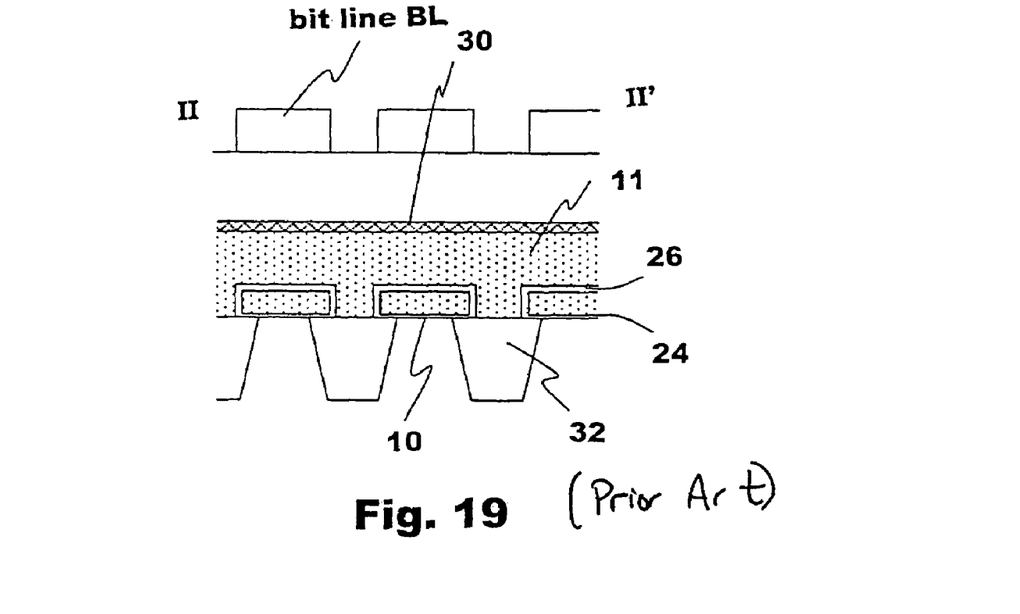
FIG. 19 is a cross sectional view along line II–II' of a portion of FIG. 16.

In addition, as shown in FIG. 19, each memory cell MC is isolated from the other cells by means of an isolation region 32 formed in a trench created in the surface of the silicon substrate 17. The floating gate 25 is placed on the gate insulating film 24 above active region 10 so that a portion of the floating gate 25 overlaps the isolation region 32. The floating gate 25 is surrounded by the ONO film 26 and the control gate 11 is placed above the floating gate 25.

Figure 20:
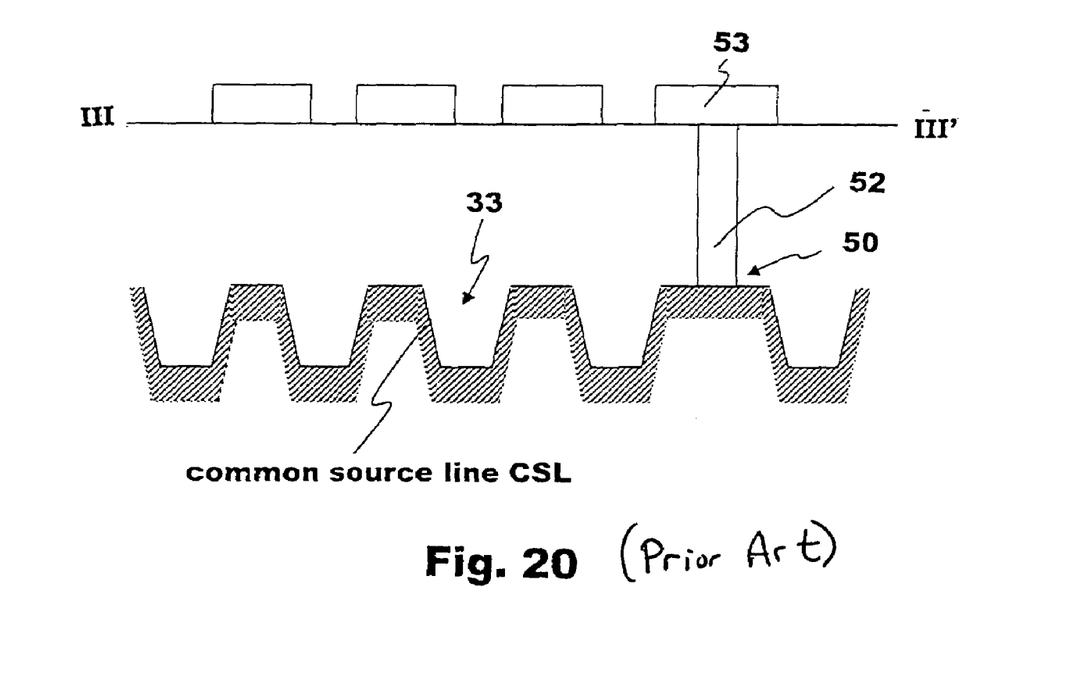
FIG. 20 is a cross sectional view along line III–III' of a portion of FIG. 16.

Furthermore, as shown in FIG. 20, the oxide film of the isolation region 32 is removed from a space between control gates 11 on the source side so that common source line CSL formed of an $N^+$ diffusion layer is wired parallel to the control gate 11. The common source line CSL is connected to a metal wire 53 via contact plugs 52 placed in intervals ranging from several memory cells to several dozens of memory cells and, thereby, the sources of all the memory cells are shared within the same block.

In such a flash memory, for example, the drain is set at 5V, the control gate is set at 10V, the source and the P well are set at 0V and, thereby, hot electrons that have been generated in the vicinity of the drain are injected into the floating gate so that data is written in.

In addition, for example, the control gate is set at −10V, the drain is opened, the source and the P well are set at 10V and, thereby, an FN tunnel current is allowed to flow from the floating gate to the source and channel region so that the data is erased.

Furthermore, a voltage of 5V is supplied to the gate, a voltage of 1V is supplied to the drain and a voltage of 0V is supplied to the source and P well and, thereby, the data is read out. The existence of data can be determined because a cell in the written-in condition has a high threshold value due to a charge being stored in the floating gate preventing a current from flowing while a cell in the erased condition allows a current to flow.

It is usually necessary in a flash memory to maintain a low resistance in the common source line in order to maintain a rapid random access time at the time of read out.

On the other hand, it is necessary to restrict the impurity concentration of the source and the diffusion of impurities caused by heat treatments so that the effective channel length is secured in order to prevent a short channel effect. Therefore, it has been difficult for a conditional flash memory to maintain a low resistance in the source as miniaturization of the device progresses.

Thus, a technique has been proposed wherein the common source line is formed of a diffusion layer having a low concentration and a silicide layer is formed on this diffusion layer in a self-aligned manner and, thereby, an increase in the source resistance can be restricted (for example, Japanese unexamined patent publication No. HEI 10 (1998)-74915).

However, the more miniaturization of the device progresses where the width of the common source line is reduced, the less an increase in the source resistance can be ignored and, therefore, a further reduction in the source resistance is required at the present condition.

SUMMARY OF THE INVENTION

The present invention provides a non-volatile semiconductor memory device comprising: a first conductive type well formed within a semiconductor substrate; and a memory cell having a gate insulating film, a floating gate, an insulating film, a control gate and a pair of source/drain region, the gate insulating film, the floating gate, the insulating film, the control gate being layered in this order above the first conductive type well, the pair of source/drain regions being made up of second conductive type diffusion layers and formed within the first conductive type well, wherein the above described source region is electrically connected to the first conductive type well.

In addition, the present invention provides a manufacturing method of a non-volatile semiconductor memory device, comprising: the step (a) of forming a first conductive type well and a trench isolation film in a semiconductor substrate; the step (b) of forming a gate insulating film, a floating gate, an insulating film and a control gate in this order above the semiconductor substrate obtained in the step (a); the step (c) of forming source/drain regions by implanting ions of second conductive type impurities using the control gate as a mask; the step (d) of forming a resist pattern that covers the drain region and a portion of the control gate and completely removing the trench isolation film adjacent to the source region using the resist pattern as a mask to form a trench; the step (e) of implanting ions of first conductive type impurities using the resist pattern as a mask again so as to form a first conductive type high concentration region at a bottom and/or on a side of the trench; and the step (f) of forming a silicide layer for electrically connecting the first conductive type high concentration region to the source region so that the source region and the first conductive type well are electrically connected to each other.

DESCRIPTION OF THE PREFERRED EMBODIMENT

A non-volatile semiconductor memory device according to the present invention is formed of at least one, preferably a plurality of, memory cell(s) arranged in a matrix form, wherein each memory cell has a gate insulating film, a floating gate, an insulating film, a control gate and a pair of source/drain region, the gate insulating film, the floating gate, the insulating film, the control gate being layered in this order above the first conductive type well, the pair of source/drain regions being made up of second conductive type diffusion layers and formed within the first conductive type well, wherein the source region is electrically connected to the first conductive type well.

Semiconductor substrates, preferably a silicon substrate, which are usually used for forming a semiconductor device, can be used as the above described semiconductor substrate. At least one first conductive type well is formed in the semiconductor substrate. The first conductive type well is formed of boron, or the like, so as to have an impurity concentration of approximately $1 \times 10^{17}/cm^3$.

In addition, the first conductive type well is connected to a wire via a contact so that a predetermined voltage can be applied to the first conductive type well. It is appropriate for a high concentration region having a first conductive type impurity concentration higher than that of the well to be formed in the contact and, furthermore, it is preferable for a silicide layer, a barrier metal layer, or the like, to be formed on the surface of the contact. Approximately $1 \times 10^{20}/cm^3$, for example, can be cited as the impurity concentration of the high concentration region. It is preferable for the silicide layer to be made up of a refractory metal such as titanium, tungsten or cobalt, and in particular cobalt is more preferable. Titanium nitride, tungsten nitride, and the like, can be-cited as the barrier metal layer. Here, one or a plurality of first-conductive type well(s) may be formed in the surface of the semiconductor substrate and may be formed in one or more first and/or second conductive type well(s) or one or more first and/or second conductive type well(s) may be placed therein.

An isolation region is formed in the semiconductor substrate and thereby active regions are defined. The isolation region can be formed of a variety of isolation films such as a trench oxide film, and an STI film, and the like. Here, the width, the depth and the like, of the trench for forming the isolation region are not particularly limited, but rather can be appropriately adjusted in accordance with the characteristics of the semiconductor memory device to be gained. It is preferable for the active region to be placed in a band form, and in the case where a plurality of active regions exist, it is preferable for the respective active regions to be parallel to each other and placed in striped form. Elements, such as transistors, capacitors and resistors, interlayer insulating films, circuits or semiconductor devices made up of these, and the like, may further be combined to the semiconductor memory device on the semiconductor substrate so as to form a single or multi layered structure.

Here, in the case where a first conductive type well and an isolation region are both formed in the semiconductor substrate, they can be formed according to a method known in the art and either one may be formed first.

The gate insulating film can be formed of silicon oxide, silicon nitride or a layered film of these. The film thickness is not particularly limited and approximately 5 nm to 15 nm, for example, can be cited.

The floating gate is not particularly limited as long as it is formed of a conductive material and can be formed of, for example, amorphous, single crystal or polycrystal N type semiconductor (for example, silicon). The floating gate is placed below a control gate described later and it is preferable for the floating gate to be completely surrounded by the below described insulating film.

The insulating film includes insulating films such as an interlayer insulating film or a capacitor insulating film, which can exercise a variety of functions, and the material thereof, the film thickness thereof, and the like, are not particularly limited as long as it is usually utilized in a semiconductor device. A single layered film or a multi layered film of a silicon oxide film (a thermal oxide film, a low temperature oxide film, such as an LTO film, a high temperature oxide film such as an HTO film), a silicon nitride film, an SOG film, a PSG film, a BSG film, a BPSG film, a PZT film, a PLZT film, a ferroelectric film and an antiferroelectric film, for example, can be cited.

The control gate can be formed of the same material as the floating gate. In particular, it is preferable to be formed of a polysilicon film. It is preferable for the control gate to be formed so as to be perpendicular to the direction in which the active region extends, and in the case where a plurality of control gates exists, it is preferable for the control gates to be placed in striped form so as to be parallel to each other. The surface of the control gate(s) may be converted to a silicide.

The gate insulating film, the floating gate, the insulating film and the control gate can be formed by using methods known in the art. Here, sidewalls may be formed of an insulating film on the sides of the floating gate, the insulating film and the control gate. In this case, the insulating film can be selected from the above described films. In particular, a silicon oxide film or a silicon nitride film is appropriate.

The source/drain regions are formed of second conductive type impurity diffusion layers and are formed so as to be self-aligned with the floating gate, the control gate and the sidewalls, when the sidewalls exist, in a region adjacent to the isolation region where the floating gate and the control gate are not placed in the active region, that is to say, in the surface of the semiconductor substrate. The impurity concentration of the source/drain regions is not particularly limited and approximately $1\times10^{19}/cm^3$ to $10\times10^{20}/cm^3$ of phosphorous, arsenic, and the like, can be cited. Here, the impurity concentration of the source region and the impurity concentration of the drain region may not be necessarily the same, but rather, it is preferable for the impurity concentration of the source region to be lower than the impurity concentration of the drain region. As a result of this, it becomes possible to the further miniaturize the device. In addition, a silicide layer may be formed on the surface of the source/drain regions.

The drain region is shared by two memory cells adjacent to each other in the direction in which the active regions extend. The source region is shared by two memory cells adjacent to each other in the direction in which the active regions extend and is electrically connected to the first conductive type well. It is appropriate for the electrical connection between the source region and the first conductive type well to be made via a conductive material taking into consideration both the forward direction and the backward direction of the PN junctions. The same conductive material that forms the control gate can be used as the conductive material and a low value of resistance is preferable. In particular, a silicide layer is appropriate and a cobalt silicide is preferable. In addition, it is preferable for a first conductive type high concentration region to be formed in the first conductive type well so that this high concentration region and the source region are connected to each other by means of the conductive material taking into consideration the connection resistance between the source region and the first conductive type well. It is preferable to form the high concentration region in a trench adjacent the source region so that the high concentration region can be placed only at the bottom of the trench, at the bottom and on the sides or only on the sides. The high concentration region may, or may not, make contact with the source region placed in the surface of the semiconductor substrate between trenches. Concretely speaking, it is appropriate for the layer of the conductive material to be placed ranging from the bottom and/or the sides of the trench to the surface of the semiconductor between trenches in the condition of being located between floating gates, and between control gates, so as to be electrically isolated from them so that the source region and the high concentration region are connected to each other. It is preferable for the layer of the conductive material to be placed parallel to the control gate when viewed from the top. The film thickness of the layer of the conductive material is not particularly limited and approximately 5 nm to 50 nm, for example, can be cited. In addition, the width thereof can be appropriately adjusted by changing the width between control gates and approximately 80 nm to 300 nm, for example, can be cited taking the source resistance into consideration.

The source/drain regions can be formed according to a method known in the art and can be formed, for example, by means of an ion implantation using the control gate and sidewalls, when the sidewalls exist, as a mask.

In addition, the first conductive type high concentration region can be formed in the following. First, a resist pattern is formed so as to cover a portion of the control gate and the drain region or the region where the drain region is to be formed and, then, the trench isolation film adjacent to the source region or the region where the source region is to be formed is completely removed by using the above described resist pattern as a mask. Next, ions of a first conductive type impurity are implanted by using this resist pattern, which is left remaining, as a mask. In this case, the ion implantation may be carried out only once in the direction inclined by approximately 10° to 40° from the surface of the semiconductor substrate or may be carried out twice or more by changing the implantation energy or the angle of inclination and alternately the ion implantation may be carried out only once in the direction perpendicular to the surface of the semiconductor substrate or may be carried out twice or more by changing the implantation energy or the angle of inclination or may be carried out a plurality of times by combining these types of ion implantations.

Here, either the formation of the source/drain regions or the formation of the first conductive type high concentration region may be carried out first.

In addition, as for a method of electrically connecting the source region to the first conductive type well, a refractory metal film, for example, is formed on the entire surface of the semiconductor substrate including the previously gained first conductive type high concentration region and source region. Approximately 5 nm to 15 nm, for example, can be cited as the film thickness of the refractory metal film in this case. After that, the refractory metal and the silicon are made to react to each other by carrying out a heat treatment so as to form a silicide layer. Furthermore, the refractory metal film that has not been reacted is removed and, thereby, a silicide layer ranging from at least the source region to the first conductive type high concentration region can be formed so as to achieve the electrical connection of the source region to the first conductive type well. Here, the formation of the refractory metal film, the heat treatment, and the removal of the unreacted refractory metal film can be carried out by well-known methods in the art, respectively.

The non-volatile semiconductor memory device according to the present invention can be applied in an electronic data processing apparatus, such as a cellular phone, a personal computer, an electronic organizer or the like, in particular for a rapid readout of a variety of data.

In the following, the preferred embodiments of a non-volatile semiconductor memory device and of a manufacturing method of the same according to the present invention are described in detail in reference to the drawings.

Figure 1:
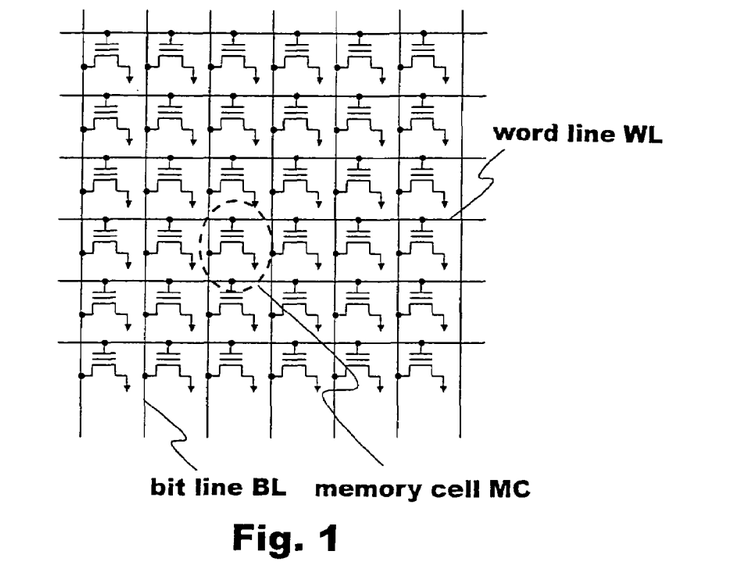
FIG. 1 is an equivalent circuit diagram showing a memory cell array of a non-volatile semiconductor memory device according to the present invention.

The equivalent circuit diagram of FIG. 1 shows the layout of a flash memory cell array as an example of the non-volatile semiconductor memory device according to the present-invention. In this memory cell array, bit lines BL connected to the drains of memory cells MC and word lines WL for selecting a control gate of a memory cell are wired so as to cross at right angles, wherein memory cells MC are arranged in a matrix form and the sources of the memory cells are individually connected to the P well.

Figure 2:
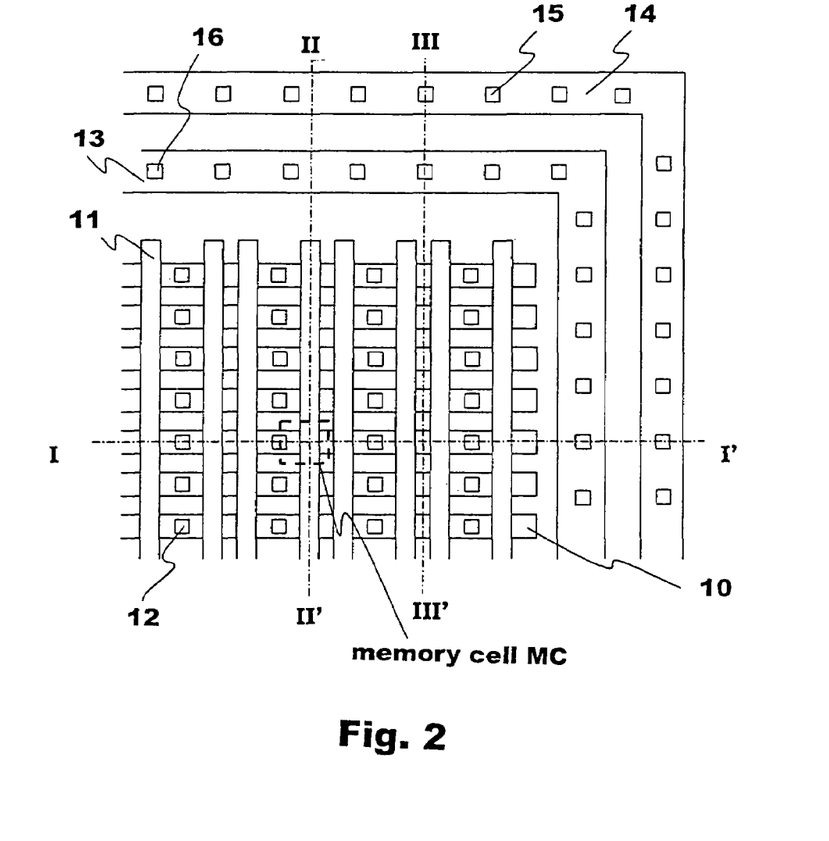
FIG. 2 is a plan view showing the memory cell array of the non-volatile semiconductor memory device according to the present invention.

This memory cell array is shown in the plan view of FIG. 2. The memory cell array has control gates 11 aligned (in the Y direction in FIG. 2) above active regions 10 aligned in striped form (in the X direction in FIG. 2) so that the control gates 11 and the active regions 10 cross at right angles. In addition, floating gates (not shown) are arranged below the control gates 11 above the active regions 10 via an ONO film (not shown), which is an insulating film independently for each bit. Bit lines (not shown) are connected to the drains via drain contacts 12 while word lines (not shown) are wired parallel to the control gates 11 so that the word lines and the bit lines cross at right angles. A $P^+$ diffusion layer 13 for supplying a potential to the P well (not shown) and an $N^+$ diffusion layer 14 for supplying a potential to the N well (not shown), which is formed to surround the P well, are arranged outside of the memory cell array and are connected to metal wires (not shown) via contact plugs 15 and 16 respectively.

Figure 3:
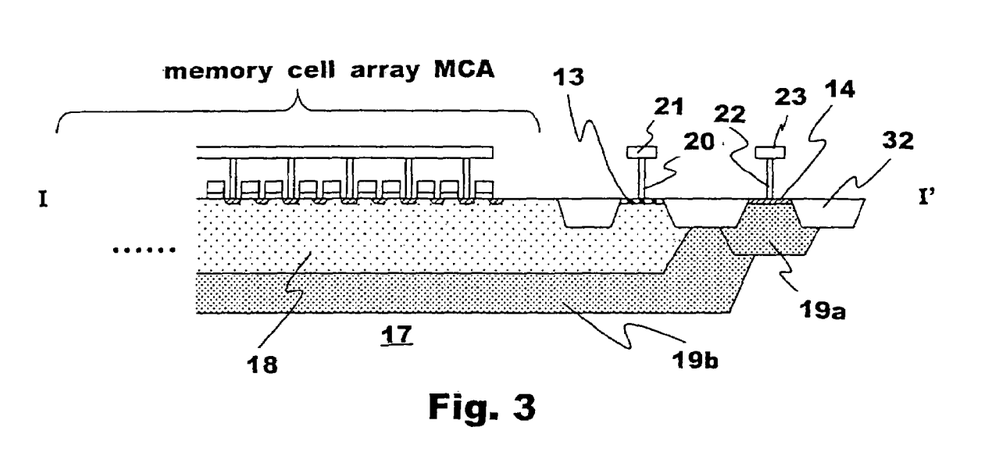
FIG. 3 is a cross sectional view along line I–I' of FIG. 2.

In addition, in this memory cell array, a triple well is formed within a silicon substrate 17 (a semiconductor substrate) as shown in the cross sectional view of FIG. 3 and memory cell array MCA is formed on a P well 18 (a first conductive type well). This P well 18 is surrounded by an N well 19 and is electrically separated into blocks made up of a plurality of memory cells MC. The $P^+$ diffusion layer 13 for supplying a potential to the P well 18 and contact plugs 20 are formed around the memory cell array MCA and are connected to a metal wire 21. In addition, the $N^+$ diffusion layer 14 for supplying a potential to the N well 19 and contact plugs 22 are formed around the P well 18 and are connected to a metal wire 23.

Figure 4:
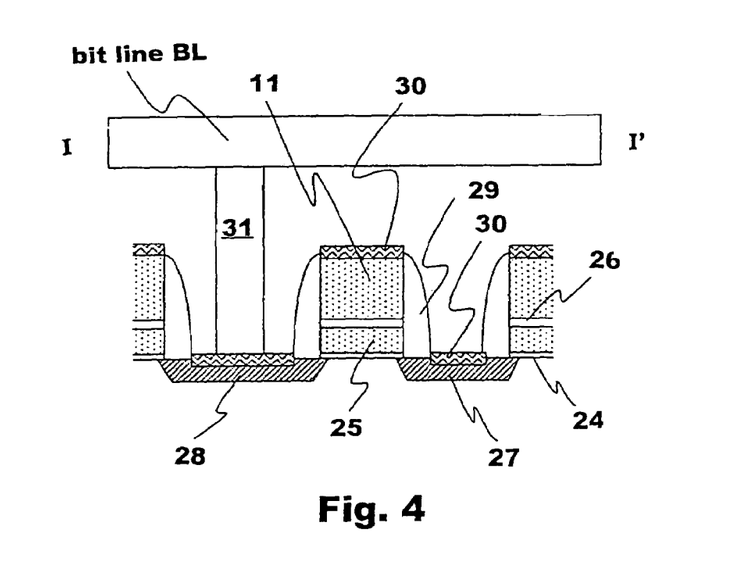
FIG. 4 is a cross sectional view along line I–I' of a portion of FIG. 2.

As shown in FIG. 4, a floating gate 25, an ONO film 26 (a insulating film) and a control gate 11 are layered above the P well 18 via a gate insulating film 24 in a memory cell MC where a source 27 and a drain 28 (second conductive type diffusion layers) are formed of $N^+$ diffusion layers so as to be self-aligned with the control gate 11. In addition, sidewalls 29 are formed of an insulating layer (for example, oxide film) in a self-aligned manner on the sides of the floating gate 25 and the control gate 11 which have been layered and silicide layers 30 are formed on the source 27, the drain 28 and the control gate 11 in a self-aligned manner. The drain 28 of the memory cell MC is connected to a bit line BL via a contact plug 31 which is placed so as to be shared by two adjacent cells.

Figure 5:
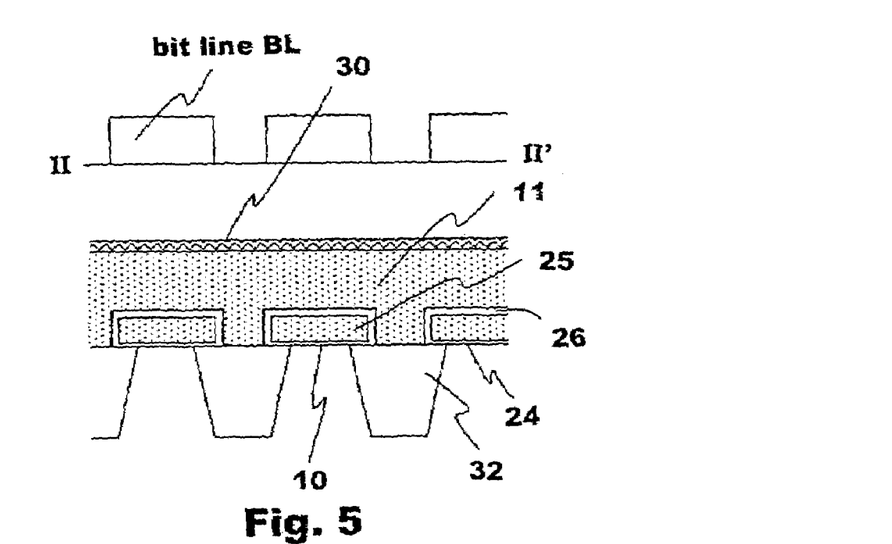
FIG. 5 is a cross sectional view along line II–II' of a portion of FIG. 2.

In addition, an oxide film is filled into a trench created within the P well in this memory cell array MCA resulting in the formation of an isolation region 32 while the floating gate 25 is formed on the gate insulating film 24 located on the active region 10. The floating gate 25 is surrounded by an ONO film 26 and control gate 11 is placed above floating gate 25.

Figure 6:
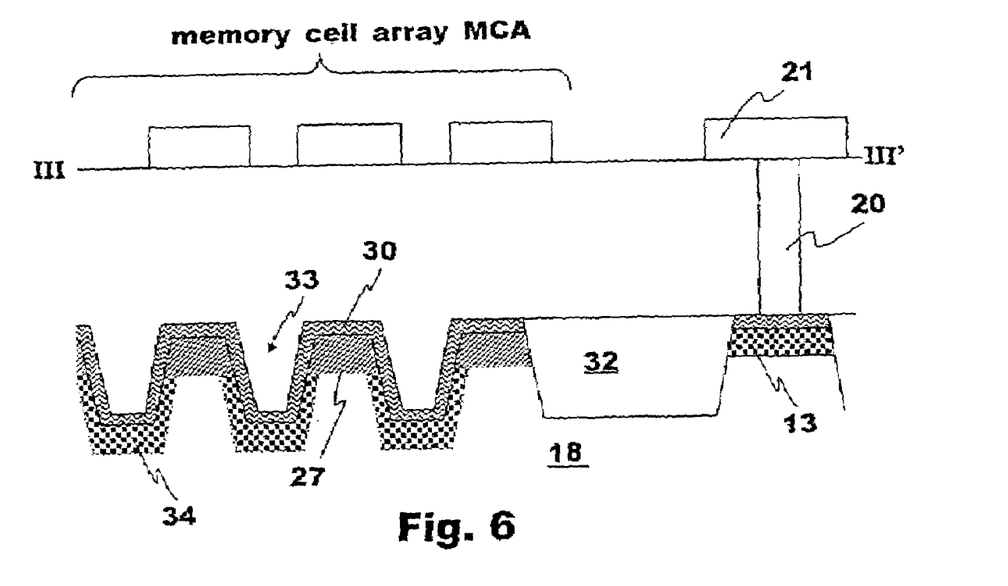
FIG. 6 is a cross sectional view along line III–III' of a portion of FIG. 2.

Furthermore, as shown in FIG. 6, $N^+$ diffusion layers are formed as sources 27 in the active regions 10 in the spaces between each of the control gates 11 on the source 27 sides while the oxide film is removed from the isolation region 32 and $P^+$ diffusion layers 34 are formed in trenches 33. In addition, the silicide layer 30 is formed in a self-aligned manner in the spaces between each of the control gates 11 so that $N^+$ diffusion layers 27 and the $P^+$ diffusion layers 34 (a first conductive type high concentration region) are connected to each other. The $P^+$ diffusion layer 13 is located in the outer periphery of the memory cell array MCA and is connected to the metal wire 21 via the contact plugs 20.

Such a flash memory cell array can be formed according to the method described below.

Figure 7:
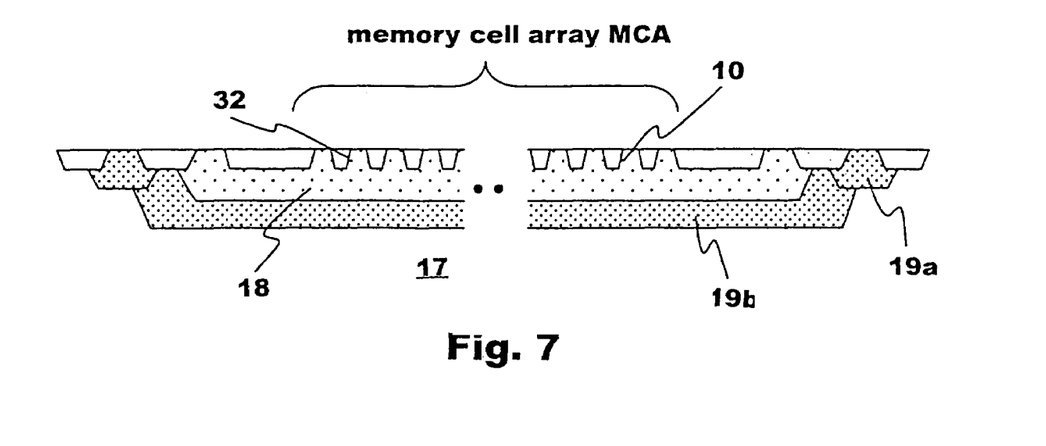
FIG. 7 is a cross sectional view of the non-volatile semiconductor memory device showing a step of a manufacturing method according to the present invention.

First, as shown in FIG. 7, the active regions 10 and the isolation region 32 are formed in the P type silicon substrate 17. The isolation region 32 is formed by, for example, filling in a shallow trench with an oxide film. The film thickness of the oxide film of the isolation region 32 is approximately 300 nm.

After the formation of the isolation region 32, phosphorous is implanted into the silicon substrate 17 by using a photo resist pattern as a mask so as to form an N well 19a and a deep N well 19b, and boron is also implanted resulting in the formation of the P well 18. As for the formation conditions of these wells, phosphorous is implanted with an implantation energy of 3 MeV and a dose of $5\times10^{12}/cm^2$ for the formation of the deep N well 19b; and phosphorous is implanted in two stages: with an implantation energy of 330 keV and a dose of $2\times10^{12}/cm^2$ for the formation of the N well 19a; and with an implantation energy of 800 keV and a dose of $5\times10^{12}/cm^2$ for the formation of the N well 19a.

Boron is implanted in two stages: with an implantation energy of 150 keV and a dose of $5\times10^{12}$/cm$^2$; and with an implantation energy of 350 keV and a dose of $4\times10^{12}$/cm$^2$ for the formation of the P well 18. Here, the memory cell array MCA is formed on the P well 18 surrounded by the N well 19a and the deep N well 19b.

Figure 8:
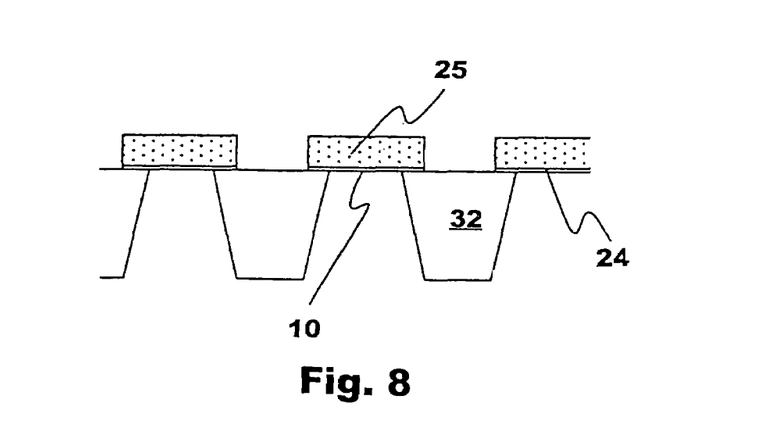
FIG. 8 is a cross sectional view of the non-volatile semiconductor memory device showing another step of the manufacturing method according to the present invention.

Next, as shown in FIG. 8, the gate insulating film 24 is formed on the active regions 110 so as to have a film thickness of approximately 10 nm, and a polysilicon film (film thickness thereof is, for example, 150 nm), into which phosphorous and the like has been implanted, is formed and patterned so as to cover the active regions 10 and so that portions of the polysilicon film overlap the isolation region 32 and, thereby, the floating gates 25 are formed.

Figure 9:
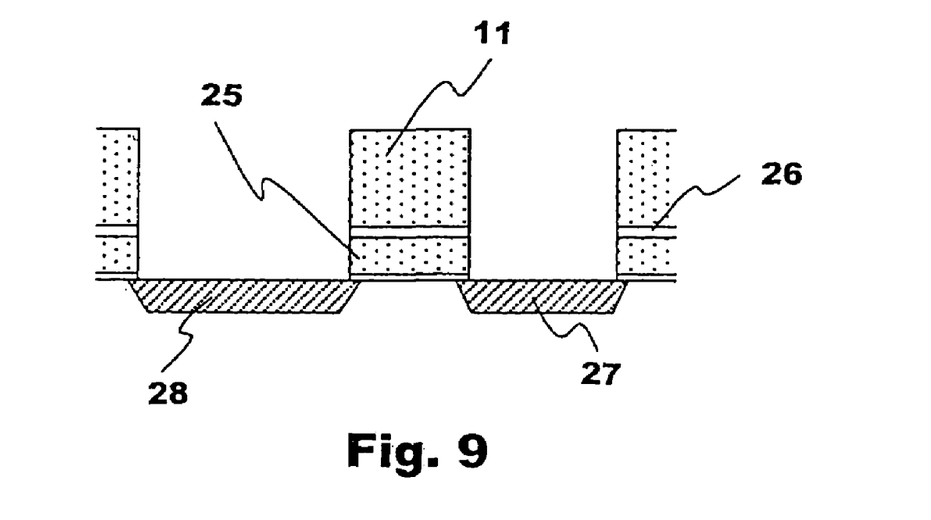
FIG. 9 is a cross sectional view of the non-volatile semiconductor memory device showing another step of the manufacturing method according to the present invention.

Subsequently, as shown in FIG. 9, the ONO film 26 is formed of an oxide film having a film thickness of 6 nm, a nitride film having a film thickness of 5 nm and an oxide film having a film thickness of 7 nm, and a polysilicon film is formed on the ONO film 26 so as to have a film thickness of 300 nm. After that, the polysilicon, the ONO film 26 and the floating gate 25 are sequentially patterned and, thereby, the control gates 11 are formed so as to be arranged in the direction perpendicular to the active regions 10. At this time, the floating gates 25 are arranged beneath the control gates 11 and, thereby, are separated for each memory cell. That is to say, the floating gates 25 in striped form aligned in the X direction are separated into each memory cell at the time of the pattern formation of the control gates in striped form in the Y direction. Then, arsenic is implanted under the conditions of, for example, an implantation energy of 15 keV and a dose of $1\times10^{15}$/cm$^2$ to $2\times10^{15}$/cm$^2$ and, thereby, the drains 28 and the sources 27 (N$^+$ diffusion layers) are formed.

Figure 10:
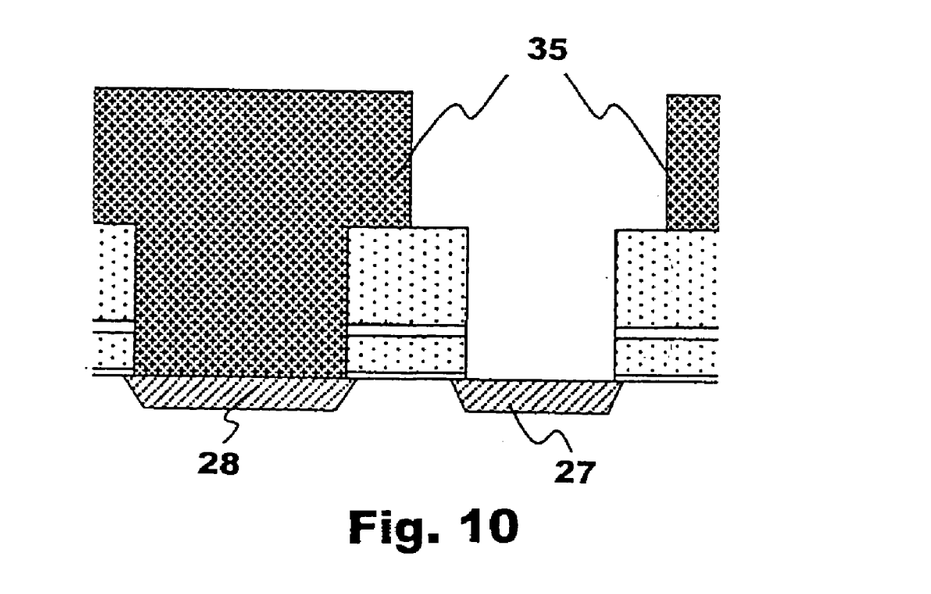
FIG. 10 is a cross sectional view of the non-volatile semiconductor memory device showing another step of the manufacturing method according to the present invention.

After that, as shown in FIG. 10, a photo resist pattern 35 is formed so as to cover portions of the control gates 11 and the drains 28 on the drain 28 sides and then the oxide film of the isolation region 32 on the source 27 sides is removed by using the photo resist pattern and the control gates 11 as a mask.

Figure 11:
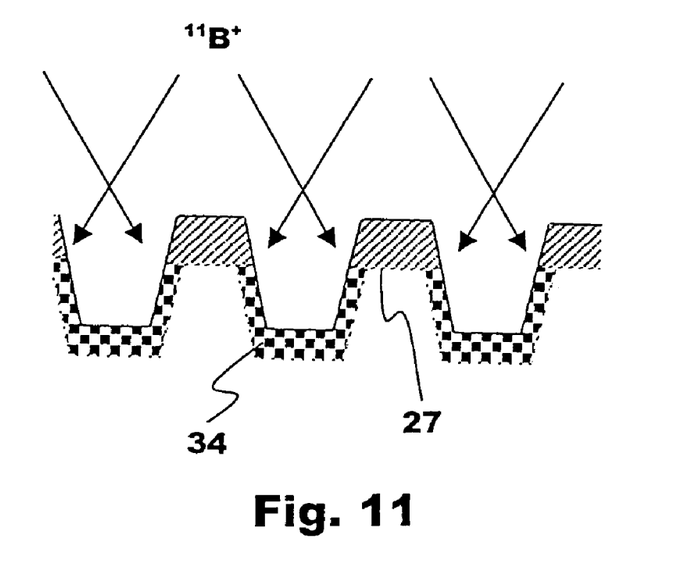
FIG. 11 is a cross sectional view of the non-volatile semiconductor memory device showing another step of the manufacturing method according to the present invention.
Figure 12:
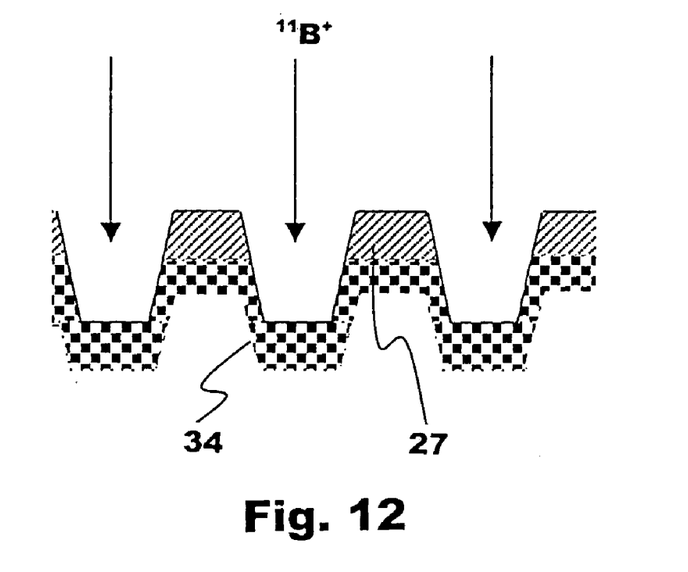
FIG. 12 is a cross sectional view of the non-volatile semiconductor memory device showing another step of the manufacturing method according to the present invention.

Subsequently, ions of boron or the like are implanted using the photo resist pattern 35 and the control gates 11 as a mask and, thereby, the P$^+$ diffusion layers 34 are formed at the bottoms and on the lower sides of the trenches 33 in the isolation region 32 after the removal of the oxide film. At this time, the ion implantation is carried out twice, for example, as shown in FIG. 11 wherein boron is implanted twice at an angle of approximately ±10° to 40° relative to the direction parallel to the control gates with an implantation energy of approximately 10 keV to 30 keV and a dose of approximately $0.5\times10^{14}$/cm$^2$ to $1\times10^{14}$/cm$^2$. As a result, the sources 27 are maintained as N$^+$ diffusion layers and the P$^+$ diffusion layers 34 can be formed at the bottoms and on the lower sides of the trenches 33 in the isolation region 32 on the source sides. Alternately, as another method shown in FIG. 12, boron may be implanted once at an angle of 0° relative to the surface of the substrate with, for example, an implantation energy of approximately 30 keV to 80 keV and a dose of approximately $1\times10^{14}$/cm$^2$ to $2\times10^{14}$/cm$^2$. As a result, boron is implanted at positions deeper than the N$^+$ diffusion layers of the sources 27 and is diffused by means of a subsequent heat treatment and, thereby, the P$^+$ diffusion layers 34 can be formed at the bottoms and on the lower sides of the trenches 33.

Figure 13:
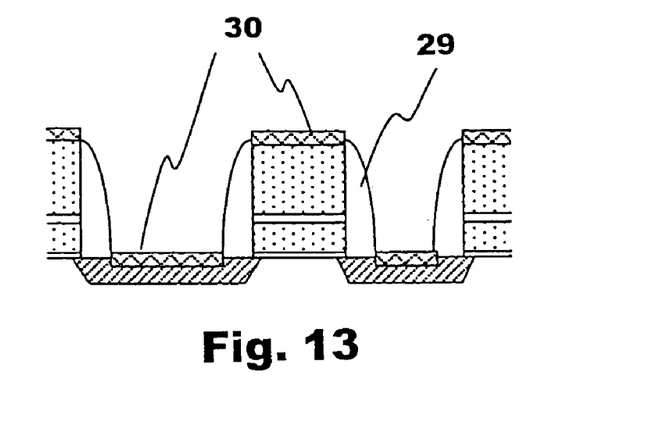
FIG. 13 is a cross sectional view of the non-volatile semiconductor memory device showing another step of the manufacturing method according to the present invention.

Next, after the heat treatment has been carried out for the activation, a CVD oxide film, for example, is deposited as shown in FIG. 13, and is etched back so that sidewalls 29 are formed on the sides of the control gates 11 and the floating gates 25. After that, a cobalt film is deposited on the entire surface of the substrate so as to have, for example, a thickness of 10 nm, and is annealed for one minute at 500° C. to 550° C. so that the cobalt and the silicon are made to react with each other in the regions where the cobalt and the silicon make contact and, thereby, cobalt silicide layers 30 are formed. Subsequently, the cobalt that has not reacted is removed with a mixed liquid of sulfuric acid and hydrogen peroxide. As a result, the cobalt silicide layers 30 are formed only on the sources 27/drains 28, the control gates 11 and the regions from which the oxide film of the isolation region of the sources 27 has been removed and, thus, the sources 27 can be connected to the P well 18 via the silicide layers 30 and the P$^+$ diffusion layers 34.

Figure 14:
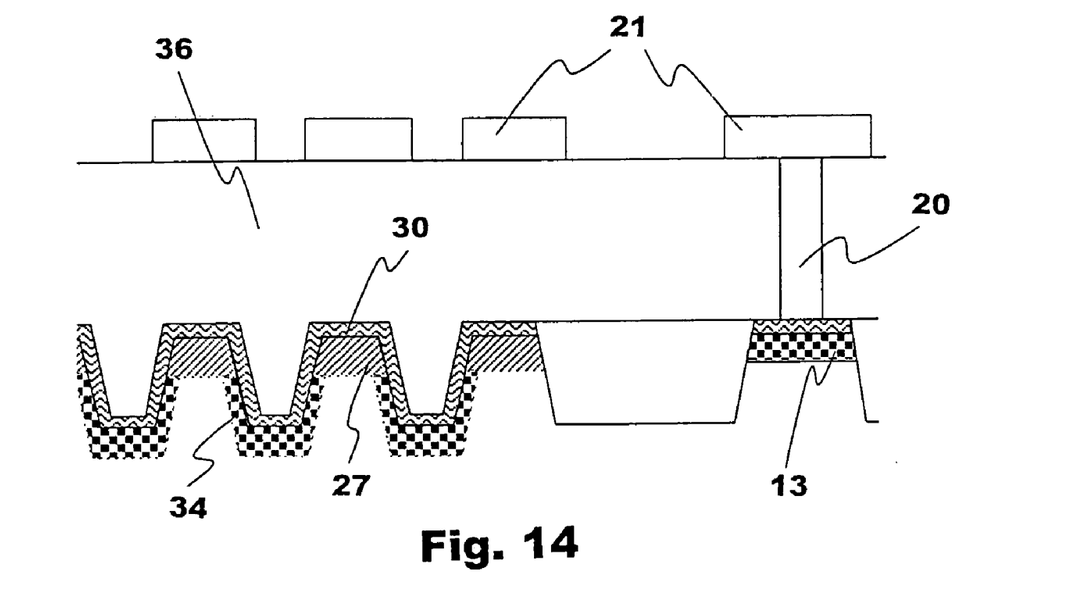
FIG. 14 is a cross sectional view of the non-volatile semiconductor memory device showing another step of the manufacturing method according to the present invention.

Subsequently, as shown in FIG. 14, a CVD oxide film is deposited as an interlayer insulating film 36 so as to have a thickness of, for example, approximately 1500 nm, and the surface thereof is flattened by means of CMP (chemical mechanical polishing) so that the contact plugs 20 as well as the metal wires 21 are formed.

Such a flash memory can be operated in the following manner so as to carry out write-in, erasure and read-out.

Write-in of data can be carried out by supplying, for example, a voltage of 5 V to the drain, a voltage of 10 V to the control gate and a voltage of 0 V to the source and the P well, so that the hot electrons generated in the vicinity of the drain are injected into the floating gate.

Erasure of data can be carried out by supplying, for example, a voltage of −10 V to the gate and a voltage of 10 V to the source and the P well and by opening the drain, so that an FN tunnel current is allowed to flow through the channel region.

Read-out of data can be carried out by supplying, for example, a voltage of 5 V to the gate, a voltage of 1 V to the drain and a voltage of 0 V to the source and the P well, so that the existence of data can be determined from the condition of the cell, wherein a threshold value is high due to a charge stored in the floating gate, preventing current from flowing under the write-in condition, while current is allowed to flow under the erasure condition.

As described above, write-in, erasure and read-out can be carried out according to the same method, as used in the prior art, without change. Accordingly, the same write-in and erasure speeds as in the prior art can be maintained without changing the circuit to a great extent, and the advantage of a rapid random access is not lost.

It was confirmed that the resistance of the source diffusion layers of this flash memory is reduced to one tenth, or lower, of that of the prior art in the case of comparison between the blocks having the same number of cells. In addition, in the case wherein the concentration of the source diffusion layers described in the prior art is set lower than the concentration of the drain diffusion layers, the reduction of the channel length, due to the diffusion of the source diffusion layers in the lateral direction, can be restricted and, therefore, it becomes possible to further miniaturize the device.

The present invention can provide a non-volatile semiconductor memory device that can implement a low source resistance so as to implement a further miniaturization and increase the performance of the memory cell without greatly changing the structure and the layout of the memory cell from the prior art. That is to say, the source region and the first conductive type well are electrically connected to each other and thereby the first conductive type well can be used as a source wire so that it becomes possible to maintain a low resistance in the source region without affecting the resistance in the first conductive type well even when the spaces between the control gates on the source region sides are reduced. In addition, the source region can be maintained at a low resistance even when the impurity concentration of the source region is lowered so that it becomes possible to further miniaturize the device. Accordingly, a rapid random access can be easily achieved, and a non-volatile semiconductor memory device which is suitable for the miniaturization of the memory cell can be provided.

In addition, the common source line is formed according to a conventional method wherein the source region is electrically connected to the first conductive-type well and, therefore, contact regions for connecting metal wires to diffusion wires which are placed in intervals ranging from several memory cells to several dozens of memory cells become unnecessary so that a further reduction in the area of the memory cell array becomes possible.

Furthermore, it becomes possible, according to the present invention, to manufacture a non-volatile semiconductor memory device that can easily and simply miniaturize the device and enhance the performance of the device without increasing the complexity of the manufacturing process only by minimally modifying the manufacturing process in order to make an electrical connection between the source region and the first conductive type well.

What is claimed is:

1. A non-volatile semiconductor memory device comprising:
    a first conductive type well formed within a semiconductor substrate; and
    a memory cell having a gate insulating film, a floating gate, an insulating film, a control gate and a pair of source/drain region,
    the gate insulating film, the floating gate, the insulating film, the control gate being layered in this order above the first conductive type well,
    the pair of source/drain regions being made up of second conductive type diffusion layers and formed within the first conductive type well,
    wherein the source region is electrically connected to the first conductive type well via at least a high concentration region formed in a trench, and
    wherein the drain region is shared by two adjacent memory cells in a direction in which an active region extends, and the source region is also shared by two memory cells adjacent to each other in the direction in which the active region extends and is electrically connected to the first conductive well.

2. The device of claim 1, wherein the source region and the first conductive type well are electrically connected to each other via a suicide layer.

3. The device of claim 2, wherein the silicide layer is made of a cobalt silicide.

4. A non-volatile semiconductor memory device comprising:
    a first conductive type well formed within a semiconductor substrate; and
    a memory cell having a gate insulating film, a floating gate, an insulating film, a control gate and a pair of source/drain region,
    the gate insulating film, the floating gate, the insulating film, the control gate being layered in this order above the first conductive type well,
    the pair of source/drain regions being made up of second conductive type diffusion layers and formed within the first conductive type well,
    wherein the source region is electrically connected to the first conductive type well;
    wherein the source region and the first conductive type well are electrically connected to each other via a silicide layer comprising cobalt silicide;
    a trench formed in the vicinity of the source region and a first conductive type high concentration region formed on a surface of the trench,
    wherein the silicide layer electrically connects the source region to the first conductive type high concentration region so that the source region and the first conductive type well are electrically connected to each other via the first conductive type high concentration region and the silicide layer, and
    wherein the drain region is shared by two adjacent memory cells in a direction in which an active region extends, and the source region is also shared by two memory cells adjacent to each other in the direction in which the active region extends and is electrically connected to the first conductive well.

5. The device of claim 1, wherein the memory cell comprises a plurality of memory cells arranged in a matrix form, the plurality of control gates are placed to be parallel to each other, a plurality of active regions are placed to be perpendicular to the control gates, the drain region is shared by the memory cells adjacent to each other in a direction in which the active regions extend, and the source regions of the memory cells each are electrically connected to the first conductive type well.

6. A manufacturing method of a non-volatile semiconductor memory device, comprising:
    the step (a) of forming a first conductive type well and a trench isolation film in a semiconductor substrate;
    the step (b) of forming a gate insulating film, a floating gate, an insulating film and a control gate in this order above the semiconductor substrate obtained in the step (a);
    the step (c) of forming source/drain regions by implanting ions of second conductive type impurities using the control gate as a mask;
    the step (d) of forming a resist pattern that covers the drain region and a portion of the control gate and completely removing the trench isolation film adjacent to the source region using the resist pattern as a mask to form a trench;
    the step (e) of implanting ions of first conductive type impurities using the resist pattern as a mask again so as to form a first conductive type high concentration region at a bottom and/or on a side of the trench; and
    the step (f) of forming a suicide layer for electrically connecting the first conductive type high concentration region to the source region so that the source region and the first conductive type well are electrically connected to each other, and
    wherein the drain region is shared by two adjacent memory cells in a direction in which an active region extends, and the source region is also shared by two memory cells adjacent to each other in the direction in which the active region extends and is electrically connected to the first conductive well.

7. A manufacturing method of a non-volatile semiconductor memory device, the method comprising:
    the step (a) of forming a first conductive type well and a trench isolation film in a semiconductor substrate;
    the step (b) of forming a gate insulating film, a floating gate, an insulating film and a control gate in this order above the semiconductor substrate obtained in the step (a);

the step (c) of forming source/drain regions by implanting ions of second conductive type impurities using the control gate as a mask;

the step (d) of forming a resist pattern that covers the drain region and a portion of the control gate and completely removing the trench isolation film adjacent to the source region using the resist pattern as a mask to form a trench;

the step (e) of implanting ions of first conductive type impurities using the resist pattern as a mask again so as to form a first conductive type high concentration region at a bottom and/or on a side of the trench;

the step (f) of forming a suicide layer for electrically connecting the first conductive type high concentration region to the source region so that the source region and the first conductive type well are electrically connected to each other; and wherein the formation of the silicide layer in the step (f) comprises forming a refractory metal film on the entire surface of the semiconductor substrate obtained in the step (e), carrying out a heat treatment to form the silicide layer such that the silicide layer covers at least a side wall of the source and an upper portion of the source region and removing an unreacted refractory metal film.

8. The device of claim 1, wherein the source region is electrically connected to the first conductive type well via at least the high concentration region formed in the trench which is located adjacent the source region, and wherein the source region is in electrical connection with the high concentration region via at least a silicide layer.

9. The method of claim 6, wherein the formation of the silicide layer in the step (f) comprises forming a refractory metal film on the entire surface of the semiconductor substrate obtained in the step (e), carrying out a heat treatment to form the silicide layer such that the silicide layer covers at least a side wall of the source and an upper portion of the source region and removing an unreacted refractory metal film.

* * * * *